(12) United States Patent
Tomura et al.

(10) Patent No.: US 12,532,681 B2
(45) Date of Patent: Jan. 20, 2026

(54) ETCHING METHOD AND PLASMA PROCESSING SYSTEM

(71) Applicant: Tokyo Electron Limited, Tokyo (JP)

(72) Inventors: Maju Tomura, Miyagi (JP); Yoshihide Kihara, Miyagi (JP); Masanobu Honda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 311 days.

(21) Appl. No.: 18/121,029

(22) Filed: Mar. 14, 2023

(65) Prior Publication Data

US 2023/0230844 A1 Jul. 20, 2023

Related U.S. Application Data

(63) Continuation-in-part of application No. PCT/JP2022/019125, filed on Apr. 27, 2022.

(60) Provisional application No. 63/185,660, filed on May 7, 2021, provisional application No. 63/184,997, filed on May 6, 2021.

(51) Int. Cl.
*H01L 21/311* (2006.01)
*H01J 37/32* (2006.01)
*H01L 21/3065* (2006.01)

(52) U.S. Cl.
CPC .. *H01L 21/31116* (2013.01); *H01J 37/32091* (2013.01); *H01J 37/32449* (2013.01); *H01J 37/32816* (2013.01); *H01L 21/3065* (2013.01); *H01L 21/31144* (2013.01); *H01J 2237/3346* (2013.01)

(58) Field of Classification Search
CPC ........... H01L 21/31116; H01L 21/3065; H01L 21/31144; H01L 21/32137; H01J 37/32091; H01J 37/32449; H01J 37/32816; H01J 2237/3346; H01J 37/32724
USPC ........................................... 216/67
See application file for complete search history.

(56) References Cited

U.S. PATENT DOCUMENTS

| | | | |
|---|---|---|---|
| 4,568,410 A | * | 2/1986 | Thornquist ............. C04B 41/91 257/E21.252 |
| 2002/0016078 A1 | | 2/2002 | Ionov et al. |
| 2017/0178894 A1 | | 6/2017 | Stone et al. |

(Continued)

FOREIGN PATENT DOCUMENTS

| | | |
|---|---|---|
| JP | 6-151383 A | 5/1994 |
| JP | 9-27472 A | 1/1997 |

(Continued)

OTHER PUBLICATIONS

International Search Report and Written Opinion mailed on Jun. 28, 2022, received for PCT Application PCT/JP2022/019125, filed on Apr. 27, 2022, 9 pages including English Translation.

*Primary Examiner* — Duy Vu N Deo
(74) *Attorney, Agent, or Firm* — XSENSUS LLP

(57) ABSTRACT

A technique improves etch selectivity. An etching includes (a) providing, in a chamber, a substrate including an underlying film and a silicon-containing film on the underlying film, (b) etching the silicon-containing film to form a recess with first plasma generated from a first process gas containing a hydrogen fluoride gas until before the underlying film is exposed at the recess or until the underlying film is partly exposed at the recess, and (c) further etching the silicon-containing film at the recess under a condition different from a condition of (b).

20 Claims, 11 Drawing Sheets

(56) References Cited

U.S. PATENT DOCUMENTS

2017/0365487 A1* 12/2017 Shen ..................... C23C 16/56
2020/0263309 A1* 8/2020 Tanaka .............. H01L 21/31116

FOREIGN PATENT DOCUMENTS

| JP | 11-307512 A | 11/1999 |
| JP | 2000-150413 A | 5/2000 |
| JP | 2006-278436 A | 10/2006 |
| JP | 2017-22136 A | 1/2017 |
| KR | 2020-0100555 A | 8/2020 |

* cited by examiner

ETCHING METHOD AND PLASMA PROCESSING SYSTEM

CROSS-REFERENCE TO RELATED APPLICATIONS

The present application is a bypass continuation-in-part application of International Application No. PCT/JP2022/019125, filed Apr. 27, 2022, which contains subject matter related to, and claims the benefit of the earlier filing date to, U.S. provisional application 63/185,660, filed May 7, 2021, U.S. provisional application 63/184,997, filed May 6, 2021, the entire contents of each of which being incorporated herein by reference. This application is also related to U.S. Ser. No. 17/666,570, entitled: ETCHING METHOD, filed on Feb. 8, 2022 and U.S. Ser. No. 17/092,376, entitled: SUBSTRATE PROCESSING METHOD AND SUBSTRATE PROCESSING APPARATUS, filed on Nov. 9, 2020, the entire contents of which are incorporated herein by reference.

FIELD

Exemplary embodiments of the present disclosure relate to an etching method and a plasma processing system.

BACKGROUND

A technique for etching a silicon-containing film included in a substrate using a mask containing amorphous carbon or an organic polymer is described in Patent Literature 1.

CITATION LIST

Patent Literature

Patent Literature 1: Japanese Unexamined Patent Application Publication No. 2016-39310

BRIEF SUMMARY

Technical Problems

One or more aspects of the present disclosure are directed to a technique for improving etch selectivity.

Solutions to Problems

An etching method according to one exemplary embodiment of the present disclosure includes (a) providing, in a chamber, a substrate including an underlying film and a silicon-containing film on the underlying film, (b) etching the silicon-containing film to form a recess with first plasma generated from a first process gas containing a hydrogen fluoride gas until before the underlying film is exposed at the recess or until the underlying film is partly exposed at the recess, and (c) further etching the silicon-containing film at the recess under a condition different from a condition of (b).

Advantageous Effects

The technique according to one exemplary embodiment of the present disclosure improves etch selectivity.

DETAILED DESCRIPTION

Figure 1:
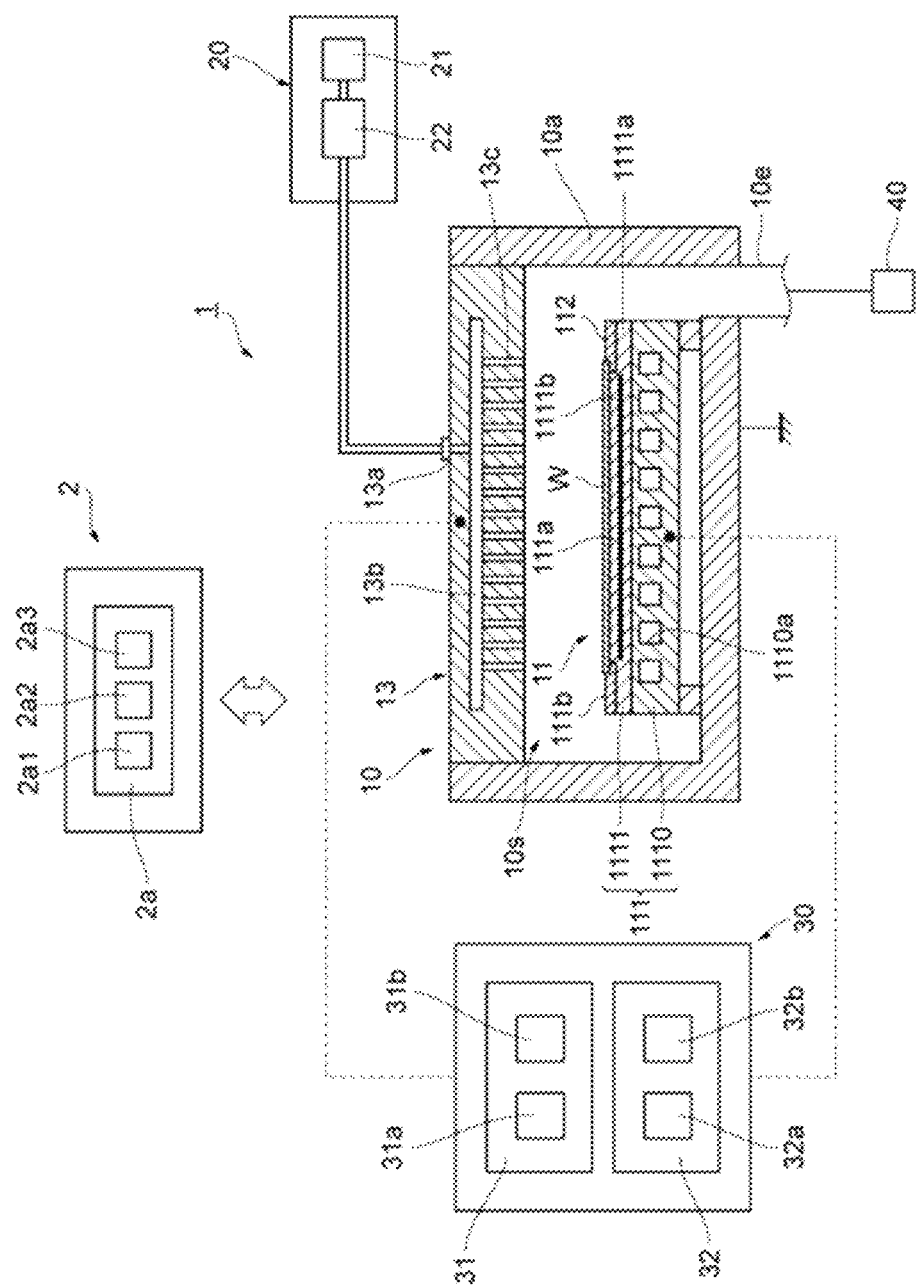
FIG. 1 is a schematic diagram of an exemplary plasma processing system.

One or more embodiments of the present disclosure will be described below.

An etching method according to one exemplary embodiment includes (a) providing, in a chamber, a substrate including an underlying film and a silicon-containing film on the underlying film, (b) etching the silicon-containing film to form a recess with first plasma generated from a first process gas containing a hydrogen fluoride gas until before the underlying film is exposed at the recess or until the underlying film is partly exposed at the recess, and (c) further etching the silicon-containing film at the recess under a condition different from a condition of (b).

In one exemplary embodiment, (c) includes generating second plasma using a second process gas different from the first process gas.

In one exemplary embodiment, the second plasma has lower density of a fluorine species than the first plasma.

In one exemplary embodiment, the underlying film contains silicon, and the second process gas contains at least 50 vol % of a fluorocarbon gas or a hydrofluorocarbon gas and an oxygen-containing gas with respect to a total flow rate of a non-inert component of the second process gas.

In one exemplary embodiment, the fluorocarbon gas or the hydrofluorocarbon gas contained in the second process gas has at least two carbon atoms.

In one exemplary embodiment, the underlying film contains metal, the first process gas contains a fluorine-containing gas other than hydrogen fluoride, and the second process gas is free of the fluorine-containing gas or contains the fluorine-containing gas at a partial pressure lower than a partial pressure in the first process gas.

In one exemplary embodiment, the fluorine-containing gas contains at least one of an $NF_3$ gas or an $SF_6$ gas.

In one exemplary embodiment, the second process gas further contains at least one of a CO gas or a chlorine-containing gas.

In one exemplary embodiment, (c) includes controlling a temperature of the substrate to be higher than in (b).

In one exemplary embodiment, the controlling the temperature includes at least one selected from the group consisting of (I) increasing power of a source radio frequency signal or power of a bias signal provided to the chamber, (II) reducing an attracting force of a substrate support supporting the substrate, (III) reducing pressure of a heat-transfer gas supplied between the substrate and the substrate support, and (IV) increasing a set temperature of the substrate support to be higher than in (b).

In one exemplary embodiment, the controlling the temperature includes controlling the temperature of the substrate to be at least 30° C. higher than in (b).

In one exemplary embodiment, (c) includes controlling pressure in the chamber to be lower than in (b).

In one exemplary embodiment, the controlling the pressure includes controlling the pressure in the chamber to be at least 30% lower than in (b).

In one exemplary embodiment, the first process gas further contains a phosphorus-containing gas.

In one exemplary embodiment, the first process gas contains at least one of a carbon-containing gas or an oxygen-containing gas.

In one exemplary embodiment, (b) includes controlling a temperature of a substrate support supporting the substrate to be 20° C. or lower.

In one exemplary embodiment, the chamber receives a source radio frequency signal having a frequency of 40 MHz or higher.

An etching method according to one exemplary embodiment is includes (a) providing, in a chamber, a substrate including an underlying film and a silicon-containing film on the underlying film, (b) etching the silicon-containing film to form a recess with plasma containing a hydrogen fluoride species until before the underlying film is exposed at the recess or until the underlying film is partly exposed at the recess, and (c) further etching the silicon-containing film at the recess under a condition different from a condition of (b).

In one exemplary embodiment, the hydrogen fluoride species is generated from at least one of a hydrogen fluoride gas or a hydrofluorocarbon gas.

In one exemplary embodiment, the hydrogen fluoride species is generated from a hydrofluorocarbon gas having at least two carbon atoms.

In one exemplary embodiment, the hydrogen fluoride species is generated from a mixture gas containing a hydrogen source and a fluorine source.

A plasma processing system according to one exemplary embodiment includes a plasma processing apparatus including a chamber, and a controller. The controller controls operations including (a) providing, in the chamber, a substrate including an underlying film and a silicon-containing film on the underlying film, (b) etching the silicon-containing film to form a recess with first plasma generated from a first process gas containing a hydrogen fluoride gas until before the underlying film is exposed at the recess or until the underlying film is partly exposed at the recess, and (c) further etching the silicon-containing film at the recess under a condition different from a condition of (b).

One or more embodiments of the present disclosure will now be described with reference to the drawings. In the figures, the same or similar components are given the same reference numerals, and may not be described repeatedly. Unless otherwise specified, the positional relationships shown in the drawings are used to describe the vertical, lateral, and other positions. The drawings are not drawn to scale relative to the actual ratio of each component, and the actual ratio is not limited to the ratio in the drawings.

Example Structure of Plasma Processing System

An example structure of a plasma processing system will now be described. FIG. 1 is a diagram of a capacitively coupled plasma processing apparatus showing its example structure.

The plasma processing system includes a capacitively coupled plasma processing apparatus 1 and a controller 2. The capacitively coupled plasma processing apparatus 1 includes a plasma processing chamber 10, a gas supply unit 20, a power supply 30, and an exhaust system 40. The plasma processing apparatus 1 also includes a substrate support 11 and a gas inlet unit. The gas inlet unit allows at least one process gas to be introduced into the plasma processing chamber 10. The gas inlet unit includes a shower head 13. The substrate support 11 is located in the plasma processing chamber 10. The shower head 13 is located above the substrate support 11. In one embodiment, the shower head 13 defines at least a part of the ceiling of the plasma processing chamber 10. The plasma processing chamber 10 has a plasma processing space 10s defined by the shower head 13, a side wall 10a of the plasma processing chamber 10, and the substrate support 11. The plasma processing chamber 10 has at least one gas inlet for supplying at least one process gas into the plasma processing space 10s and at least one gas outlet for discharging the gas from the plasma processing space 10s. The plasma processing chamber 10 is grounded. The shower head 13 and the substrate support 11 are electrically insulated from a housing of the plasma processing chamber 10.

The substrate support 11 includes a body 111 and a ring assembly 112. The body 111 includes a central area 111a for supporting a substrate W and an annular area 111b for supporting the ring assembly 112. A wafer is an example of the substrate W. The annular area 111b of the body 111 surrounds the central area 111a of the body 111 as viewed in plan. The substrate W is located on the central area 111a of the body 111. The ring assembly 112 is located on the annular area 111b of the body 111 to surround the substrate W on the central area 111a of the body 111. Thus, the central area 111a is also referred to as a substrate support surface for supporting the substrate W, and the annular area 111b is also referred to as a ring support surface for supporting the ring assembly 112.

In one embodiment, the body 111 includes a base 1110 and an electrostatic chuck (ESC) 1111. The base 1110 includes a conductive member. The conductive member in the base 1110 may serve as a lower electrode. The ESC 1111 is located on the base 1110. The ESC 1111 includes a ceramic member 1111a and an electrostatic electrode 1111b located inside the ceramic member 1111a. The ceramic member 1111a includes the central area 111a. In one embodiment, the ceramic member 1111a also includes the annular area 111b. Other members surrounding the ESC 1111, such as an annular ESC or an annular insulating member, may include the annular area 111b. In this case, the ring assembly 112 may be located on the annular ESC or the annular insulating member, or may be located on both the ESC 1111 and the annular insulating member. At least one radio frequency (RF) electrode coupled to an RF power supply 31 or at least one direct current (DC) electrode coupled to a DC power supply 32 may also be located inside the ceramic member 1111a, or both the RF electrode and the DC electrode (described later) may also be located inside the ceramic member 1111a. In this case, at least one RF electrode or at least one DC electrode serves as a lower electrode, or both the electrodes serve as lower electrodes. When a bias RF signal, a DC signal, or both the signals (described later) are provided to at least one RF electrode, to at least one DC electrode, or to both the electrodes, the RF electrode, the DC electrode, or both the electrodes are also referred to as a bias electrode(s). The conductive member in the base 1110 and at least one RF electrode, at least one DC electrode, or both the electrodes may serve as multiple lower electrodes. The electrostatic electrode 1111*b* may also serve as a lower electrode. Thus, the substrate support 11 includes at least one lower electrode.

The ring assembly 112 includes one or more annular members. In one embodiment, one or more annular members include one or more edge rings and at least one cover ring. The edge ring is formed from a conductive material or an insulating material. The cover ring is formed from an insulating material.

The substrate support 11 may also include a temperature control module that adjusts at least one of the ESC 1111, the ring assembly 112, or the substrate W to a target temperature. The temperature control module may include a heater, a heat-transfer medium, a channel 1110*a*, or a combination of these. The channel 1110*a* allows a heat-transfer fluid such as brine or gas to flow. In one embodiment, the channel 110*a* is defined in the base 1110, and one or more heaters are located in the ceramic member 1111*a* in the ESC 1111. The substrate support 11 may include a heat-transfer gas supply unit to supply a heat-transfer gas into a space between the back surface of the substrate W and the central area 111*a*.

The shower head 13 introduces at least one process gas from the gas supply unit 20 into the plasma processing space 10*s*. The shower head 13 has at least one gas inlet 13*a*, at least one gas-diffusion space 13*b*, and multiple gas inlet ports 13*c*. The process gas supplied to the gas inlet 13*a* passes through the gas-diffusion space 13*b* and is introduced into the plasma processing space 10*s* through the multiple gas inlet ports 13*c*. The shower head 13 also includes at least one upper electrode. In addition to the shower head 13, the gas inlet unit may include one or more side gas injectors (SGIs) that are installed in one or more openings in the side wall 10*a*.

The gas supply unit 20 may include at least one gas source 21 and at least one flow controller 22. In one embodiment, the gas supply unit 20 allows supply of at least one process gas from each gas source 21 to the shower head 13 through the corresponding flow controller 22. The flow controller 22 may include a mass flow controller or a pressure-based flow controller. The gas supply unit 20 may further include one or more flow rate modulators that supply at least one gas at a modulated flow rate or in a pulsed manner.

The power supply 30 includes the RF power supply 31 that is coupled to the plasma processing chamber 10 through at least one impedance matching circuit. The RF power supply 31 allows supply of at least one RF signal (RF power) to at least one lower electrode, to at least one upper electrode, or to both the electrodes. This causes plasma to be generated from at least one process gas supplied into the plasma processing space 10*s*. The RF power supply 31 may thus at least partially serve as a plasma generator that generates plasma from one or more process gases in the plasma processing chamber 10. A bias RF signal is provided to at least one lower electrode to generate a bias potential in the substrate W, thus drawing ion components in the plasma to the substrate W.

In one embodiment, the RF power supply 31 includes a first RF generator 31*a* and a second RF generator 31*b*. The first RF generator 31*a* is coupled to at least one lower electrode, to at least one upper electrode, or to both the electrodes through at least one impedance matching circuit and generates a source RF signal (source RF power) for plasma generation. In one embodiment, the source RF signal has a frequency in a range of 10 to 150 MHz. In one embodiment, the first RF generator 31*a* may generate multiple source RF signals with different frequencies. The generated one or more source RF signals are provided to at least one lower electrode, to at least one upper electrode, or to both the electrodes.

The second RF generator 31*b* is coupled to at least one lower electrode through at least one impedance matching circuit and generates a bias RF signal (bias RF power). The frequency of the bias RF signal may be the same as or different from the frequency of the source RF signal. In one embodiment, the bias RF signal has a lower frequency than the source RF signal. In one embodiment, the bias RF signal has a frequency in a range of 100 kHz to 60 MHz. In one embodiment, the second RF generator 31*b* may generate multiple bias RF signals with different frequencies. The generated one or more bias RF signals are provided to at least one lower electrode. In various embodiments, at least one of the source RF signal or the bias RF signal may be pulsed.

The power supply 30 may also include the DC power supply 32 coupled to the plasma processing chamber 10. The DC power supply 32 includes a first DC generator 32*a* and a second DC generator 32*b*. In one embodiment, the first DC generator 32*a* is connected to at least one lower electrode and generates a first DC signal. The generated first bias DC signal is applied to at least one lower electrode. In one embodiment, the second DC generator 32*b* is connected to at least one upper electrode and generates a second DC signal. The generated second DC signal is applied to at least one upper electrode.

In various embodiments, at least one of the first DC signal or the second DC signal may be pulsed. In this case, a sequence of voltage pulses is applied to at least one lower electrode, to at least one upper electrode, or to both the electrodes. The voltage pulse may have a rectangular, trapezoidal, or triangular pulse waveform, or a combination of these pulse waveforms. In one embodiment, a waveform generator for generating a sequence of voltage pulses based on DC signals is connected between the first DC generator 32*a* and at least one lower electrode. Thus, the first DC generator 32*a* and the waveform generator are included in a voltage pulse generator. When the second DC generator 32*b* and the waveform generator are included in a voltage pulse generator, the voltage pulse generator is connected to at least one upper electrode. The voltage pulses may have positive or negative polarity. The sequence of voltage pulses may also include one or more positive voltage pulses and one or more negative voltage pulses within one cycle. The first DC generator 32*a* and the second DC generator 32*b* may be provided in addition to the RF power supply 31, or the first DC generator 32*a* may replace the second RF generator 31*b*.

The exhaust system 40 may be, for example, connected to a gas outlet 10*e* in the bottom of the plasma processing chamber 10. The exhaust system 40 may include a pressure control valve and a vacuum pump. The pressure control valve regulates the pressure in the plasma processing space 10*s*. The vacuum pump may include a turbomolecular pump, a dry pump, or a combination of these.

The controller 2 processes computer-executable instructions that cause the plasma processing apparatus 1 to perform various steps described in one or more embodiments of the present disclosure. The controller 2 may control the components of the plasma processing apparatus 1 to perform various steps described herein. In one embodiment, some or all of the components of the controller 2 may be included in the plasma processing apparatus 1. The controller 2 may include a processor 2a1, a storage 2a2, and a communication interface 2a3. The controller 2 is implemented by, for example, a computer 2a. The processor 2a1 may perform various control operations by reading a program from the storage 2a2 and executing the read program. This program may be prestored in the storage 2a2 or may be obtained through a medium as appropriate. The obtained program is stored into the storage 2a2, read from the storage 2a2, and executed by the processor 2a1. The medium may be one of various storage media readable by the computer 2a, or a communication line connected to the communication interface 2a3. The processor 2a1 may be a central processing unit (CPU). The storage 2a2 may be a random-access memory (RAM), a read-only memory (ROM), a hard disk drive (HDD), a solid-state drive (SSD), or a combination of these memories. The communication interface 2a3 may communicate with the plasma processing apparatus 1 through a communication line such as a local area network (LAN).

First Embodiment

Figure 2:
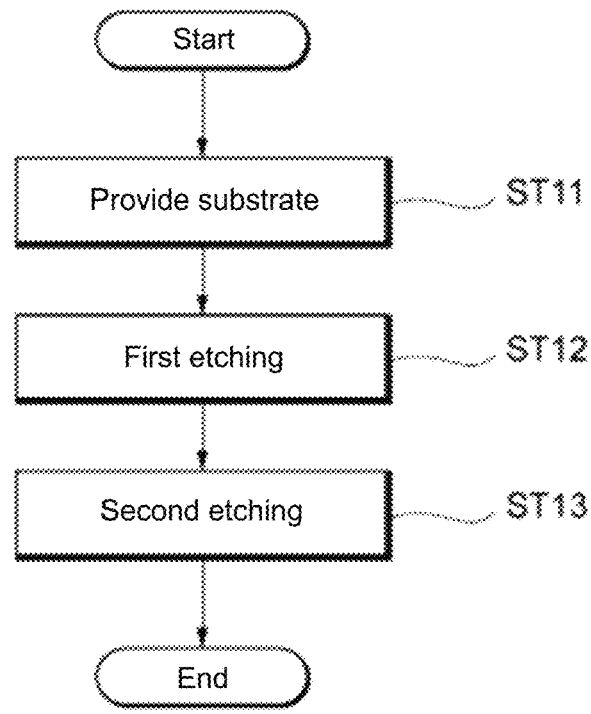
FIG. 2 is a flowchart of an etching method according to a first embodiment.

FIG. 2 is a flowchart of an etching method according to a first embodiment. As shown in FIG. 2, the etching method includes step ST11 for providing a substrate, step ST12 that is a first etching step, and step ST13 that is a second etching step. The processing in each step may be performed in a plasma processing system shown in FIG. 1. In the embodiment described below, the controller 2 controls the components of the plasma processing apparatus 1 to perform etching on a substrate W.

Step ST11: Providing Substrate

In step ST11, the substrate W is provided in a plasma processing space 10s in the plasma processing apparatus 1. The substrate W is placed on the central area 111a included in the substrate support 11. The substrate W is held on the substrate support 11 by the ESC 1111.

Figure 3:
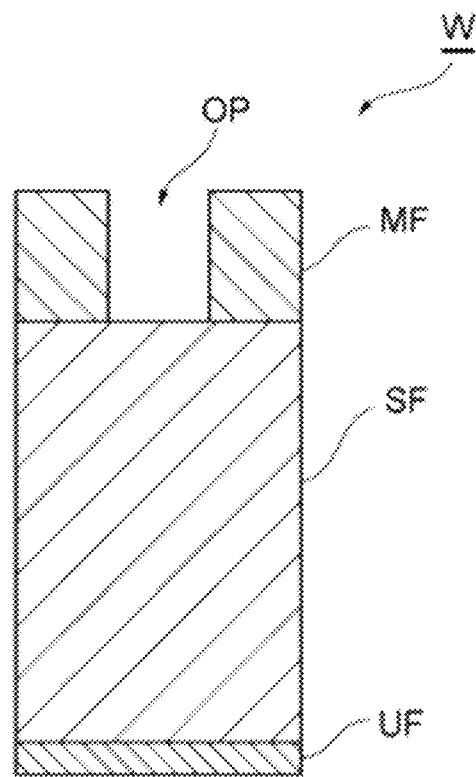
FIG. 3 is a diagram of a substrate W showing an example cross-sectional structure.

FIG. 3 is a diagram of the substrate W provided in step ST11, showing an example cross-sectional structure. The substrate W includes a silicon-containing film SF formed on an underlying film UF. The substrate W may further include a mask MF on the silicon-containing film SF. The substrate W may be used for manufacturing semiconductor devices. Examples of the semiconductor devices include semiconductor memory devices such as a dynamic random-access memory (DRAM) and a 3D-NAND flash memory.

The underlying film UF may be, for example, a silicon wafer or an organic film, a dielectric film, a metal film, or a semiconductor film formed on the silicon wafer. The underlying film UF may include multiple films stacked on one another. The underlying film UF may contain metal such as silicon or tungsten.

The silicon-containing film SF is a target of etching. Examples of the silicon-containing film SF include a silicon oxide film, a silicon nitride film, a silicon oxynitride film, a polycrystalline silicon film, and a carbon-containing silicon film. The silicon-containing film SF may include multiple films stacked on one another. For example, the silicon-containing film SF may include silicon oxide films and silicon nitride films alternately stacked on one another. For example, the silicon-containing film SF may include silicon oxide films and polycrystalline silicon films alternately stacked on one another. For example, the silicon-containing film SF may be a stacked film including a silicon nitride film, a silicon oxide film, and a polycrystalline silicon film.

The mask MF is a film that serves as a mask in the etching of the silicon-containing film SF. The mask MF may be, for example, a hard mask. The mask MF may be, for example, a carbon-containing mask, a metal-containing mask, or both. The carbon-containing mask may contain, for example, at least one selected from the group consisting of spin-on carbon, tungsten carbide, amorphous carbon, and boron carbide. The metal-containing mask may contain, for example, at least one selected from the group consisting of titanium nitride, titanium oxide, and tungsten. The tungsten-containing mask may contain, for example, tungsten silicide (WSi), tungsten carbide (WC), or both. The mask MF may be a boron-containing mask containing, for example, silicon boride, boron nitride, or boron carbide.

As shown in FIG. 3, the mask MF may define at least one opening OP above the silicon-containing film SF. The opening OP is a space above the silicon-containing film SF, surrounded by a side wall of the mask MF. In other words, the upper surface of the silicon-containing film SF includes a portion covered with the mask MF and a portion exposed through the bottom of the opening OP.

The opening OP may have any feature in a plan view of the substrate W, or in other words, when the substrate W is viewed from the top toward the bottom in FIG. 3. The opening feature may be, for example, a circle, an oval, a rectangle, a line, or a combination of one or more of these features. The mask MF may have multiple sidewalls, which may define multiple openings OP. The multiple openings OP may be slits arranged in a pattern of lines and spaces at regular intervals. The multiple openings OP may be holes arranged in a patterned array.

The films (the underlying film UF, the silicon-containing film SF, and the mask MF) included in the substrate W may each be formed by chemical vapor deposition (CVD), atomic layer deposition (ALD), spin coating, or other methods. The opening OP may be formed by etching the mask MF. The mask MF may also be formed by lithography. The films may each be a flat film or an uneven film. The substrate W may further include another film under the underlying film UF. The stacked film of the silicon-containing film SF and the underlying film UF may then serve as a multilayer mask. In other words, the stacked films of the silicon-containing film SF and the underlying film UF may be used as a multilayer mask to etch the other film.

The processing for forming each film included in the substrate W may be at least partly performed in a space in the plasma processing chamber 10. In one example, the step of etching the mask MF to form the opening OP may be performed in the plasma processing chamber 10. In other words, the etching of the opening OP and the etching of the silicon-containing film SF (described later) may be performed continuously in the same chamber. All or some of the films included in the substrate W may be formed in a device or a chamber external to the plasma processing apparatus 1. The resultant substrate W may then be loaded into the plasma processing space 10s in the plasma processing apparatus 1 and placed on the central area 111a of the substrate support 11.

After the substrate W is placed on the central area 111a of the substrate support 11, the temperature of the substrate support 11 is adjusted to a set temperature by the temperature control module. The set temperature may be, for example, 20° C. or lower, 0° C. or lower, −10° C. or lower, −20° C. or lower, −30° C. or lower, −40° C. or lower, −50° C. or lower, −60° C. or lower, or −70° C. or lower. In one example, adjusting or maintaining the temperature of the substrate support 11 includes causing the temperatures of the heat-transfer fluid flowing in the channel 110a and the heater to be set temperatures, or to be temperatures different from the set temperatures. The heat-transfer fluid may start to flow in the channel 1110a before, after, or at the same time as the substrate W is placed on the substrate support 11. The temperature of the substrate support 11 may be adjusted to the set temperature before step ST11. In other words, the substrate W may be placed on the substrate support 11 after the temperature of the substrate support 11 is adjusted to the set temperature.

Step ST12: First Etching

In step ST12, plasma generated from a first process gas is used to etch the silicon-containing film SF. The gas supply unit 20 first supplies the first process gas into the plasma processing space 10s. The first process gas contains a hydrogen fluoride (HF) gas. The HF gas serves as an etchant. During the processing in step ST12, the temperature of the substrate support 11 is maintained at the set temperature reached by the adjustment in step ST11.

A source RF signal is then provided to the lower electrode of the substrate support 11, to the upper electrode of the shower head 13, or to both the electrodes. This causes generation of an RF electric field between the shower head 13 and the substrate support 11, and generation of first plasma from the first process gas in the plasma processing space 10s. A bias signal is also provided to the lower electrode of the substrate support 11 to generate a bias potential between the plasma and the substrate W. The bias potential attracts an active species such as ions and radicals in the plasma to the substrate W. Thus, the silicon-containing film SF is etched to form a recess based on the feature of the opening OP in the mask ME. The first etching is performed until before (e.g., immediately before) the underlying film UF is exposed or until the underlying film UF is partly exposed. In other words, the processing in step ST12 ends before (e.g., immediately before) the underlying film UF of the substrate W is exposed or when the underlying film UF is partly exposed.

Figure 4:
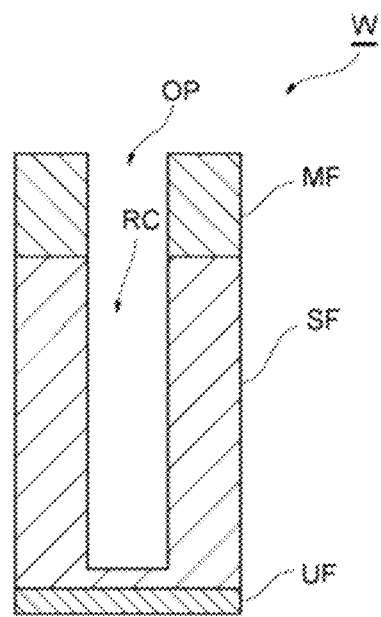
FIG. 4 is a diagram of the substrate W showing an example cross-sectional structure at the end of step ST12.

FIG. 4 is a diagram of the substrate W showing an example cross-sectional structure at the end of step ST12. As shown in FIG. 4, in the processing in step ST12, the portion of the silicon-containing film SF exposed through the opening OP is etched in the depth direction (from the top to the bottom in FIG. 4) to form a recess RC. The underlying film UF is not exposed at the end of step ST12 in FIG. 4, but the underlying film UF may be partly exposed at the end of step ST12.

In step ST12, the source RF signal may have a frequency in a range of 10 to 150 MHz. In one example, the source RF signal may have a frequency of 40 MHz or higher or 60 MHz or higher. In step ST12, the bias signal may be a bias RF signal provided from the second RF generator 31b. The bias signal may be a bias DC signal provided from the first DC generator 32a. The source RF signal and the bias signal may both be continuous waves or pulsed waves, or one signal may be continuous and the other signal may be pulsed. When both the source RF signal and the bias signal are pulsed, the cycles of the two pulsed waves may be synchronized. The pulse duty ratio may be set as appropriate, or set to, for example, 1 to 80% or 5 to 50%. The duty ratio is the percentage of the period in which the level of power or the level of voltage is higher in a pulse wave cycle. A bias DC signal used may have a rectangular, trapezoidal, or triangular pulse waveform, or a combination of these pulse waveforms. The bias DC signal may have either negative or positive polarity, and may adjust the potential of the substrate W to create a potential difference between the plasma and the substrate W to draw ions.

In step ST12, the HF gas in the first process gas may have the highest flow rate (partial pressure) of all components of the process gas (excluding any inert components contained in the process gas). In one example, the HF gas may have a flow rate of at least 50, 60, 70, 80, 90, or 95 vol % of the total flow rate of all components of the first process gas (excluding any inert components contained in the process gas). The flow rate of the HF gas may be less than 100 vol %, 99.5 vol % or less, 98 vol % or less, or 96 vol % or less of the total % or less of all components of the process gas. In one example, the HF gas is controlled to have a flow rate of 70 to 96 vol % inclusive of the total flow rate of all components of the process gas.

The first process gas may further contain at least one selected from the group consisting of a carbon-containing gas, an oxygen-containing gas, and a phosphorus-containing gas.

The carbon-containing gas may be, for example, either or both of a fluorocarbon gas and a hydrofluorocarbon gas. In one example, the fluorocarbon gas may be at least one selected from the group consisting of a $CF_4$ gas, a $C_2F_2$ gas, a $C_2F_4$ gas, a $C_3F_6$ gas, a $C_3F_8$ gas, a $C_4F_6$ gas, a $C_4F_8$ gas, and a $C_5F_8$ gas. In one example, the hydrofluorocarbon gas may be at least one selected from the group consisting of a $CHF_3$ gas, a $CH_2F_2$ gas, a $CH_3F$ gas, a $C_2HF_5$ gas, a $C_2H_2F_4$ gas, a $C_2H_3F_3$ gas, a $C_2H_4F_2$ gas, a $C_3HF_7$ gas, a $C_3H_2F_2$ gas, a $C_3H_2F_4$ gas, a $C_3H_2F_6$ gas, a $C_3H_3F_5$ gas, a $C_4H_2F_6$ gas, a $C_4H_5F_5$ gas, a $C_4H_2F_8$ gas, a $C_5H_2F_6$ gas, a $C_5H_2F_{10}$ gas, and a $C_5H_3F_7$ gas. The carbon-containing gas may have a linear chain structure with unsaturated bonds. The linear carbon-containing gas with unsaturated bonds may be, for example, at least one selected from the group consisting of a $C_3F_6$ (hexafluoropropene) gas, a $C_4F_8$ (octafluoro-1-butene, octafluoro-2-butene) gas, a $C_3H_2F_4$ (1,3,3,3-tetrafluoropropene) gas, a $C_4H_2F_6$ (trans-1,1,1,4,4,4-hexafluoro-2-butene) gas, a $C_4F_8O$ (pentafluoroethyl trifluorovinyl ether) gas, a $CF_3COF$ gas (1,2,2,2-tetrafluoroethane-1-one), a $CHF_2COF$ (difluoroacetic acid fluoride) gas, and a $COF_2$ (carbonyl fluoride) gas. The carbon-containing gas may have a linear chain structure with unsaturated bonds.

The oxygen-containing gas may be, for example, at least one gas selected from the group consisting of $O_2$, CO, $CO_2$, $H_2O$, and $H_2O_2$. In one example, the oxygen-containing gas may be at least one gas selected from the group consisting of oxygen-containing gases other than $H_2O$, or specifically, $O_2$, CO, $CO_2$, and $H_2O_2$. The flow rate of the oxygen-containing gas may be adjusted in accordance with the flow rate of the carbon-containing gas.

The phosphorus-containing gas contains a phosphorus-containing molecule. The phosphorus-containing molecule may be an oxide such as tetraphosphorus decaoxide ($P_4O_{10}$), tetraphosphorus octoxide ($P_4O_8$), or tetraphosphorus hexaoxide ($P_4O_6$). Tetraphosphorus decaoxide may also be called diphosphorus pentaoxide ($P_2O_5$). The phosphorus-containing molecule may be a halide (phosphorus halide) such as phosphorus trifluoride ($PF_3$), phosphorus pentafluoride ($PF_5$), phosphorus trichloride ($PCl_3$), phosphorus pentachloride ($PCl_5$), phosphorus tribromide ($PBr_3$), phosphorus pentabromide ($PBr_5$), or phosphorus iodide ($PI_3$). More specifically, the halogen contained in the phosphorus-containing molecule may be fluorine in, for example, a phosphorus fluoride. In some embodiments, the phosphorus-containing molecule may contain a non-fluorine halogen. The phosphorus-containing molecule may be a phosphoryl halide such as phosphoryl fluoride (POF$_3$), phosphoryl chloride (POCl$_3$), or phosphoryl bromide (POBr$_3$). The phosphorus-containing molecule may be phosphine (PH$_3$), calcium phosphide (e.g., Ca$_3$P$_2$), phosphoric acid (H$_3$PO$_4$), sodium phosphate (Na$_3$PO$_4$), or hexafluorophosphoric acid (HPF$_6$). The phosphorus-containing molecule may be a fluorophosphine (H$_g$PF$_h$), where the sum of g and h is 3 or 5. The fluorophosphine may be, for example, HPF$_2$ or H$_2$PF$_3$. The process gas may contain at least one phosphorus-containing molecule selected from the above phosphorus-containing molecules. For example, the process gas may contain at least one phosphorus-containing molecule selected from the group consisting of PF$_3$, PCl$_3$, PF$_5$, PCl$_5$, POCl$_3$, PH$_3$, PBr$_3$, and PBr$_5$. Each phosphorus-containing molecule contained in the process gas in either liquid or solid form may be vaporized by, for example, heating before being supplied into the plasma processing space 10s.

The phosphorus-containing gas may be a PCl$_a$F$_b$ gas (where a is an integer greater than or equal to 1, b is an integer greater than or equal to 0, and the sum of a and b is an integer less than or equal to 5) or a PC$_c$H$_d$F$_e$ gas (where d and e are integers of 1 to 5 inclusive, and c is an integer of 0 to 9 inclusive).

The PCl$_a$F$_b$ gas may be, for example, at least one gas selected from the group consisting of a PClF$_2$ gas, a PCl$_2$F gas, and a PCl$_2$F$_3$ gas.

The PC$_c$H$_d$F$_e$ gas may be, for example, at least one gas selected from the group consisting of a PF$_2$CH$_3$ gas, a PF(CH$_3$)$_2$ gas, a PH$_2$CF$_3$ gas, a PH(CF$_3$)$_2$ gas, a PCH$_3$(CF$_3$)$_2$ gas, a PH$_2$F gas, and a PF$_3$(CH$_3$)$_2$ gas.

The phosphorus-containing gas may be a PCl$_c$F$_d$C$_e$H$_f$gas (where c, d, e, and f are integers greater than or equal to 1). The phosphorus-containing gas may be a gas containing P (phosphorus), F (fluorine), and a halogen other than F (e.g., Cl, Br, or I) in its molecular structure, a gas containing P, F, C (carbon), and H (hydrogen) in its molecular structure, or a gas containing P, F, and H in its molecular structure.

The phosphorus-containing gas may be a phosphine gas. Examples of the phosphine gas include phosphine (PH$_3$), compounds in which at least one hydrogen atom of phosphine is substituted with an appropriate substituent, and phosphinic acid derivatives.

Hydrogen atoms of phosphine may be substituted with any substituents. Example substituents include halogen atoms such as a fluorine atom and a chlorine atom, alkyl groups such as a methyl group, an ethyl group, and a propyl group, and hydroxyalkyl groups such as a hydroxymethyl group, a hydroxyethyl group, and a hydroxypropyl group. One example may be a chlorine atom, a methyl group, or a hydroxymethyl group.

Examples of the phosphinic acid derivatives include phosphinic acid (H$_3$O$_2$P), alkyl phosphinic acid (PHO(OH)R), and dialkyl phosphinic acid (PO(OH)R$_2$).

The phosphine gas may contain, for example, at least one gas selected from the group consisting of a PCH$_3$Cl$_2$ (dichloro(methyl)phosphine) gas, a P(CH$_3$)$_2$Cl (chloro(dimethyl)phosphine) gas, a P(HOCH$_2$)Cl$_2$ (dichloro(hydroxymethyl)phosphine) gas, a P(HOCH$_2$)$_2$Cl (chloro(dihydroxylmethyl)phosphine) gas, a P(HOCH$_2$)(CH$_3$)$_2$ (dimethyl(hydroxylmethyl)phosphine) gas, a P(HOCH$_2$)$_2$(CH$_3$) (methyl(dihydroxylmethyl)phosphine)gas, a P(HOCH$_2$)$_3$ (tris(hydroxylmethyl)phosphine)gas, an H$_3$O$_2$P (phosphinic acid) gas, a PHO(OH)(CH$_3$) (methyl phosphinic acid) gas, and a PO(OH)(CH$_3$)$_2$ (dimethyl phosphinic acid) gas.

The flow rate of the phosphorus-containing gas in the first process gas may be 20 vol % or less, 10 vol % or less, or 5 vol % or less of a total flow rate of all non-inert components of the process gas.

The first process gas may further contain a tungsten-containing gas. The tungsten-containing gas may be a gas containing tungsten and halogen, for example, a WF$_x$Cl$_y$ gas (where x and y are integers of 0 to 6 inclusive, and the sum of x and y is an integer of 2 to 6 inclusive). More specifically, the tungsten-containing gas may be a gas containing tungsten and fluorine, such as a tungsten difluoride (WF$_2$) gas, a tungsten tetrafluoride (WF$_4$) gas, a tungsten pentafluoride (WF$_5$) gas, and a tungsten hexafluoride (WF$_6$) gas, or a gas containing tungsten and chlorine such as a tungsten dichloride (WCl$_2$) gas, a tungsten tetrachloride (WCl$_4$) gas, a tungsten pentachloride (WCl$_5$) gas, and a tungsten hexachloride (WCl$_6$) gas. Of these gases, the tungsten-containing gas may be at least one of a WF$_6$ gas or a WCl$_6$ gas. The first process gas may contain a titanium-containing gas or a molybdenum-containing gas instead of or in addition to a tungsten-containing gas.

The first process gas may further contain a halogen-containing gas other than fluorine. The halogen-containing gas other than fluorine may be at least one of a chlorine-containing gas, a bromine-containing gas, or an iodine-containing gas. In one example, the chlorine-containing gas may be at least one gas selected from the group consisting of Cl$_2$, SiCl$_2$, SiCl$_4$, CCl$_4$, SiH$_2$Cl$_2$, Si$_2$Cl$_6$, CHCl$_3$, SO$_2$Cl$_2$, BCl$_3$, PCl$_3$, PCl$_5$, and POCl$_3$. In one example, the bromine-containing gas may be at least one gas selected from the group consisting of Br$_2$, HBr, CBr$_2$F$_2$, C$_2$F$_5$Br, PBr$_3$, PBr$_5$, POBr$_3$, and BBr$_3$. In one example, the iodine-containing gas may be at least one gas selected from the group consisting of HI, CF$_3$I, C$_2$FI, C$_3$F$_7$I, IF$_5$, IF$_7$, I$_2$, and PI$_3$. In one example, the halogen-containing gas other than fluorine may be at least one selected from the group consisting of a Cl$_2$ gas, a Br$_2$ gas, and an HBr gas. In one example, the halogen-containing gas other than fluorine is a Cl$_2$ gas or an HBr gas.

The first process gas may further contain an inert gas. In one example, the inert gas may be a noble gas such as an Ar gas, a He gas, a Kr gas, or a nitrogen gas.

The first process gas may contain, instead of part or all of the HF gas, a gas for generating an HF species in the first plasma. The HF species include at least any of an HF gas, radicals, or ions.

The gas for generating an HF species may be, for example, a hydrofluorocarbon gas. The hydrofluorocarbon gas may have at least two, three, or four carbon atoms. In one example, the hydrofluorocarbon gas is at least one selected from the group consisting of a CH$_2$F$_2$ gas, a C$_3$H$_2$F$_4$ gas, a C$_3$H$_2$F$_6$ gas, a C$_3$H$_3$F$_5$ gas, a C$_4$H$_2$F$_6$ gas, a C$_4$H$_5$F$_5$ gas, a C$_4$H$_2$F$_8$ gas, a C$_5$H$_2$F$_6$ gas, a C$_5$H$_2$F$_{10}$ gas, and a C$_5$H$_3$F$_7$ gas. In one example, the hydrofluorocarbon gas is at least one selected from the group consisting of a CH$_2$F$_2$ gas, a C$_3$H$_2$F$_4$ gas, a C$_3$H$_2$F$_6$ gas, and a C$_4$H$_2$F$_6$ gas.

The gas for generating an HF species may be, for example, a mixture containing a hydrogen source and a fluorine source. The hydrogen source may be at least one selected from the group consisting of an H$_2$ gas, an NH$_3$ gas, an H$_2$O gas, an H$_2$O$_2$ gas, and a hydrocarbon gas (e.g., a CH$_4$ gas or a C$_3$H$_6$ gas). The fluorine source may be a carbon-free fluorine-containing gas, such as an NF$_3$ gas, an SF$_6$ gas, a WF$_6$ gas, or an XeF$_2$ gas. The fluorine source may be a carbon-containing fluorine-containing gas, such as a fluorocarbon gas or a hydrofluorocarbon gas. In one example, the fluorocarbon gas may be at least one selected from the group consisting of a $CF_4$ gas, a $C_2F_2$ gas, a $C_2F_4$ gas, a $C_3F_6$ gas, a $C_3F_8$ gas, a $C_4F_6$ gas, a $C_4F_8$ gas, and a $C_5F_8$ gas. In one example, the hydrofluorocarbon gas is at least one selected from the group consisting of a $CHF_3$ gas, a $CH_2F_2$ gas, a $CH_3F$ gas, a $C_2HF_5$ gas, and a hydrofluorocarbon gas containing at least three carbon atoms (e.g., a $C_3H_2F_4$ gas, a $C_3H_2F_6$ gas, or a $C_4H_2F_6$ gas).

Step ST13: Second Etching

The second etching step ST13 follows the first etching step ST12. In other words, the second etching step ST13 starts before the recess RC reaches the underlying film UF or when the underlying film UF is partly exposed. The shift from step ST12 to step ST13 may be based on at least one of the depth of the recess RC, the aspect ratio of the recess RC, or the etching time.

The gas supply unit 20 supplies a second process gas into the plasma processing space 10s. As in step ST12, a source RF signal is provided to the lower electrode of the substrate support 11, to the upper electrode of the shower head 13, or to both the electrodes. This causes generation of an RF electric field between the shower head 13 and the substrate support 11, and generation of second plasma from the second process gas in the plasma processing space 10s. A bias signal is also provided to the lower electrode of the substrate support 11 to generate a bias potential between the plasma and the substrate W. The bias potential attracts an active species such as ions, radicals in the plasma to the substrate W. The active species further etches the silicon-containing film SF. Step ST13 is performed until the underlying film UF is exposed or until the underlying film UF is partly etched in the depth direction. During the processing in step ST12, the temperature of the substrate support 11 may be maintained at the set temperature reached by the adjustment in step ST11, or may be changed as described later.

Figure 5:
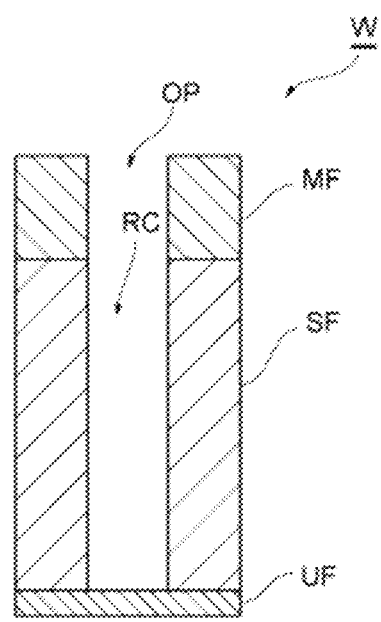
FIG. 5 is a diagram of the substrate W showing an example cross-sectional structure at the end of step ST13.

FIG. 5 is a diagram of the substrate W showing an example cross-sectional structure after the processing in step ST13. As shown in FIG. 5, in the substrate W after the processing in step ST13, the recess RC reaches the underlying film UF at its bottom, thus exposing the underlying film UF. In this state, the underlying film UF may have been partly etched in the depth direction. The recess RC in this state may have an aspect ratio of, for example, 20 or more, or 30, 40, 50, or 100 or more.

In step ST13, the second process gas may contain a gas of the same type as in the first process gas, or a gas of a different type. The second process gas may contain, for example, an HF gas. The second process gas may further contain at least one selected from the group consisting of the above carbon-containing gases, oxygen-containing gases, and phosphorus-containing gases. The second process gas may further contain, for example, the above tungsten-containing gases, titanium-containing gases, molybdenum-containing gases, inert gases, and halogen-containing gases other than fluorine. The second process gas may contain, instead of part or all of the HF gas, a gas for generating an HF species in the second plasma, similarly to the first process gas.

In step ST13, the source RF signal may have a frequency in a range of 10 to 150 MHz. In one example, the source RF signal may have a frequency of 40 MHz or higher or 60 MHz or higher. In step ST13, the bias signal may be a bias RF signal provided from the second RF generator 31b. The bias signal may be a bias DC signal provided from the first DC generator 32a. The source RF signal and the bias signal may both be continuous waves or pulsed waves, or one signal may be continuous and the other signal may be pulsed. The cycles of the source RF signal and the bias signal may be synchronized when both signals are pulsed. The pulse duty ratio may be set as appropriate, or set to, for example, 1 to 80% or 5 to 50%. The duty ratio is the percentage of the period in which the level of power or the level of voltage is higher in a pulse wave cycle. A bias DC signal used may have a rectangular, trapezoidal, or triangular pulse waveform, or a combination of these pulse waveforms. The bias DC signal may have either negative or positive polarity, and may adjust the potential of the substrate W to create a potential difference between the plasma and the substrate to draw ions. The source RF signal, the bias RF signal, or both the signals may be provided continuously from step ST12. The source RF signal, the bias RF signal, or both the signals may also be stopped at the end of step ST12 and resumed at the start of step ST13.

When step ST13 is started, the processing conditions for etching are changed from those in step ST12 (recipe 1) to those in step ST13 (recipe 2). In other words, in step ST13, the silicon-containing film SF is etched using a recipe different from the recipe in step ST12. The recipe change may include using the second process gas different from the first process gas, performing a temperature control process to increase the temperature of the substrate W higher than in step ST12, or both the processes.

In one example, the processing conditions in step ST13 (recipe 2) may increase the selectivity of the silicon-containing film SF over the underlying film UF compared with the processing conditions in step ST12 (recipe 1). In this case, the processing conditions in step ST13 (recipe 2) may be selected for the type of the underlying film UF. For example, the processing conditions may differ between an underlying film UF containing silicon and an underlying film UF containing metal. The recipe change may also include lowering the process pressure (the pressure in the chamber during processing). In other words, in step ST13, the pressure in the plasma processing space 10s may be lower than in step ST12. For example, the pressure in the plasma processing space 10s in step ST13 may be lower by 30% or more than in step ST12.

Figure 6:
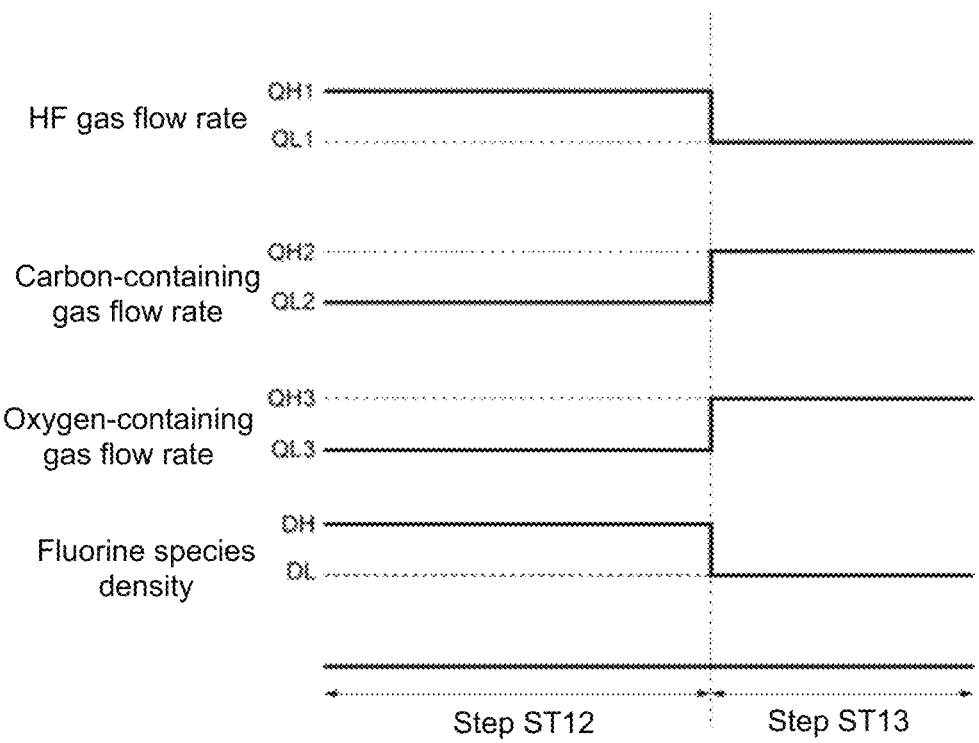
FIG. 6 is an example timing chart for a substrate including an underlying film UF containing silicon.

FIG. 6 is an example timing chart for a substrate including an underlying film UF containing silicon. In FIG. 6, the compositions of the process gases are different between step ST12 and step ST13. In FIG. 6, the horizontal axis indicates time. The vertical axis indicates the flow rates of an HF gas, a carbon-containing gas, and an oxygen-containing gas in the process gas (the first process gas or the second process gas), and the density of a fluorine species in the plasma (the first plasma or the second plasma). QL1 is a flow rate lower than QH1 or zero. QL2 is a flow rate lower than QH2 or zero. QL3 is a flow rate lower than QH3 or zero. DL is the density of the fluorine species in the plasma lower than DH. In FIG. 6, the carbon-containing gas shows the flow rate of one or both of a fluorocarbon gas and a hydrofluorocarbon gas (the total flow rate when both the gases are contained). The fluorine species shows the active species of fluorine dissociated from the fluorine-containing gas (e.g., an HF gas, a fluorocarbon gas, a hydrofluorocarbon gas, an $NF_3$ gas, or an $SF_6$ gas) in the process gas.

For an underlying film UF containing silicon, the flow rate (partial pressure) of the HF gas may be decreased and the flow rate (partial pressure) of the carbon-containing gas (the fluorocarbon gas, the hydrofluorocarbon gas, or both) and the oxygen-containing gas may be increased upon the shift from step ST12 to step ST13 as shown in FIG. 6. In one example, the shift from step ST12 to step ST13 may cause the process gas (second process gas) to contain at least 50 vol % of the carbon-containing gas and the oxygen-containing gas with respect to the total flow rate of the non-inert components of the second process gas. The fluorocarbon gas, the hydrofluorocarbon gas, or both contained in the second process gas may have at least two carbon atoms.

The underlying film UF is exposed as etching in step ST13 proceeds. For the underlying film UF containing silicon, the fluorine species in the plasma also serves as an etchant. In the example shown in the timing chart in FIG. 6, the density of the fluorine species in the second plasma generated in step ST13 is lower than the density of the fluorine species in the first plasma generated in step ST12. Thus, the underlying film UF is less likely to be etched. This improves the selectivity of the silicon-containing film SF over the underlying film UF in etching.

Figure 7:
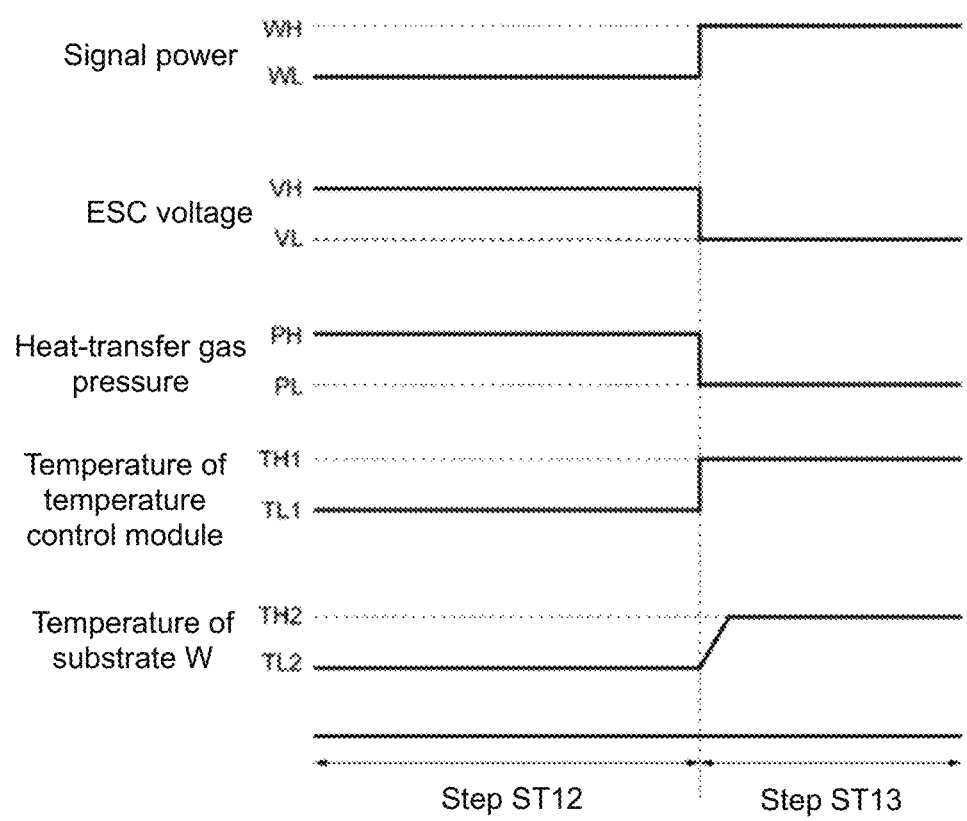
FIG. 7 is another example timing chart for a substrate including an underlying film UF containing silicon.

FIG. 7 is another example timing chart for a substrate including an underlying film UF containing silicon. FIG. 7 shows an example control pattern to increase the temperature of the substrate W in step ST13 to a higher level than in step ST12. In FIG. 7, the horizontal axis indicates time. The vertical axis indicates the power of the source RF signal (signal power), the power of the bias signal (signal power), or both, the DC voltage supplied to the ESC 1111 (ESC voltage), the pressure of a heat-transfer gas (e.g., He) between the ESC 1111 and the back surface of the substrate W, the temperature of the heat-transfer fluid flowing through the heater and the channel 1110a (the temperature of the temperature control module), and the temperature of the substrate W. In FIG. 7, WL is a signal power lower than WH. VL is an ESC voltage lower than VH. PL is a heat-transfer gas pressure lower than PH. TL1 is a temperature lower than TH1, and TL2 is a temperature lower than TH2.

As shown in FIG. 7, for the underlying film UF containing silicon, upon the shift from step ST12 to step ST13, (I) the signal power of the source RF signal, the signal power of the bias signal (the bias RF signal or the bias DC signal), or both may be increased. Increasing the signal power may include increasing the effective value of the signal power, lengthening the signal provision time, and increasing the signal duty ratio. This increases the heat input into the substrate W, thus increasing the temperature of the substrate W.

As shown in FIG. 7, upon the shift from step ST12 to step ST13, (II) the DC voltage supplied to the ESC 1111 (ESC voltage) may be reduced to reduce the attracting force of the ESC 1111, (III) the pressure of the heat-transfer gas (e.g., He gas) between the ESC 1111 and the back surface of the substrate W may be reduced, or (IV) the temperature of the heat-transfer fluid flowing through the heater and the channel 110a may be increased. Any of these increases the temperature of the substrate W. One or more of the above temperature control processes (I) to (IV) may be performed in combination. The difference between the temperature of the substrate W in step ST12 (TL2) and the temperature of the substrate W in step ST13 (TH2) may be, for example, 30° C. or higher. In one example, the temperature of the substrate W in step ST12 (TL2) may be −40° C., and the temperature of the substrate W in step ST13 (TH2) may be 0° C.

The underlying film UF is exposed as the etching in step ST13 proceeds. In the example shown in the timing chart in FIG. 7, the temperature of the substrate W is higher than in step ST12. This causes a less amount of etchant (e.g., fluorine species in the plasma) to be adsorbed on the underlying film UF. This reduces the likelihood of the underlying film UF being etched, thus improving the selectivity of the silicon-containing film SF over the underlying film UF.

Upon the shift from step ST12 to step ST13, both of the control processes to change the process gas composition (e.g., in FIG. 6) and to increase the temperature of the substrate W (e.g., in FIG. 7) may be performed.

Figure 8:
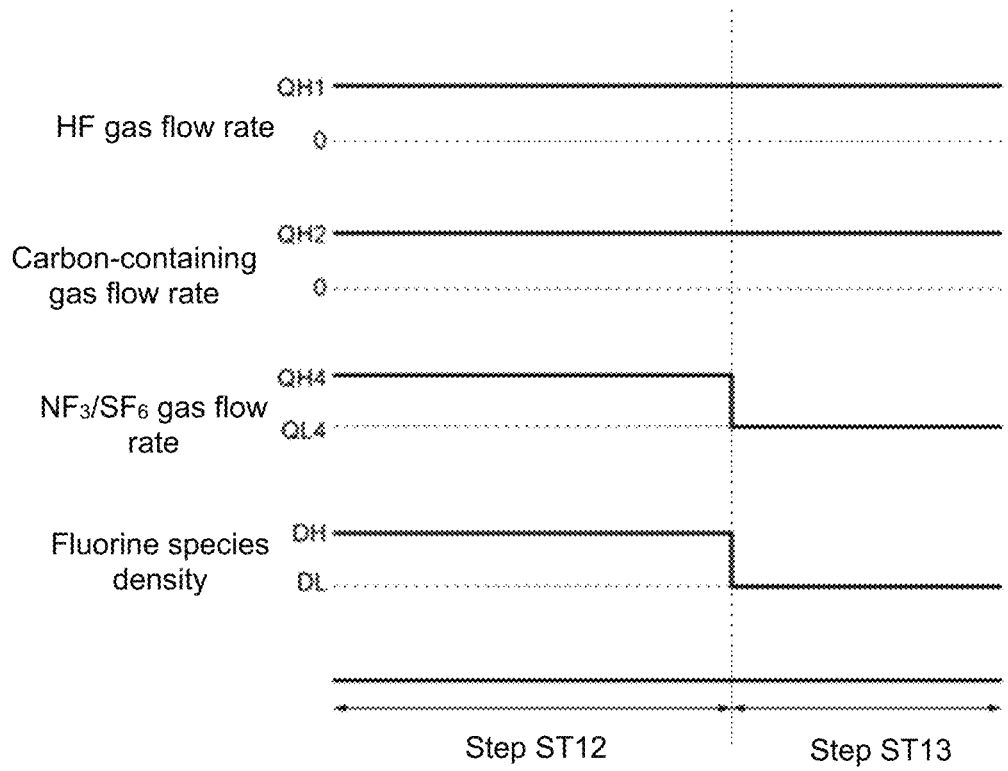
FIG. 8 is an example timing chart for a substrate including an underlying film containing metal.

FIG. 8 is an example timing chart for a substrate including an underlying film UF containing metal. In FIG. 8, the compositions of the process gases differ between step ST12 and step ST13. In FIG. 8, the horizontal axis indicates time. The vertical axis indicates the flow rates of an HF gas, a carbon-containing gas, and an $NF_3$ gas, $SF_6$ gas, or both in the process gas (the first process gas or the second process gas), and the density of a fluorine species in the plasma (the first plasma or the second plasma). QH1 and QH2 are flow rates higher than zero. QL4 is a flow rate lower than QH4 or zero. DL is the density of the fluorine species in the plasma lower than DH. In FIG. 8, the carbon-containing gas shows the flow rate of one or both of a fluorocarbon gas and a hydrofluorocarbon gas (the total flow rate when both the gases are contained). In FIG. 8, the flow rate of the $NF_3/SF_6$ gas indicates the flow rate of one or both of the $NF_3$ gas and the $SF_5$ gas (the total flow rate when both the gases are contained). The $NF_3$ gas and the $SF_6$ gas are examples of carbon-free fluorine sources described above that can be used in addition to the HF gas.

As shown in FIG. 8, for the underlying film UF containing metal, the flow rate (partial pressure) of the $NF_3$ gas, the $SF_6$ gas, or both may be reduced upon the shift from step ST12 to step ST13. In addition to this, the flow rate (partial pressure) of the HF gas may also be reduced.

The underlying film UF is exposed as the etching in step ST13 proceeds. The fluorine species in the plasma may react with the metal contained in the underlying film UF to etch the underlying film UF. In the example shown in the timing chart in FIG. 8, the density of the fluorine species in the second plasma generated in step ST13 is lower than the density of the fluorine species in the first plasma generated in step ST12. Thus, the underlying film UF is less likely to be etched. This improves the selectivity of the silicon-containing film SF over the underlying film UF in etching.

In step ST13, for the underlying film UF containing metal, the control process to increase the temperature of the substrate W may be performed. The control process to increase the temperature of the substrate W may be performed in combination with one or more of the temperature control processes (I) to (IV) described above with reference to FIG. 7. This facilitates volatilization of by-products containing the metal from the underlying film UF and reduces generation of the residual containing the metal. In addition to or instead of this, a gas that is highly reactive with the metal in the underlying film UF may be added as a component of the second process gas. For example, a CO gas may be added as a component of the second process gas for an underlying film UF containing tungsten. The CO gas reacts with W emitted from the underlying film UF during step ST13 to produce volatile $W(CO)_6$. This reduces generation of the residual containing the metal (W) from the underlying film UF. The second process gas may further contain a chlorine-containing gas such as a $Cl_2$ gas, an $SiCl_4$ gas, or a $BCl_3$ gas in addition to or instead of a CO gas.

With the etching method according to the first embodiment, step ST13 uses processing conditions (recipe) different from those in step ST12 to etch the silicon-containing film SF. This allows an optimum recipe to be selected for the progress of etching, or specifically for the depth of the recess RC. For example, a recipe to increase the etching rate of the silicon-containing film SF can be selected in areas with the recess RC being shallow, and another recipe for increasing etch selectivity over the underlying film UF can be selected in areas with the recess RC being as deep as to expose the underlying film UF.

Second Embodiment

Figure 9:
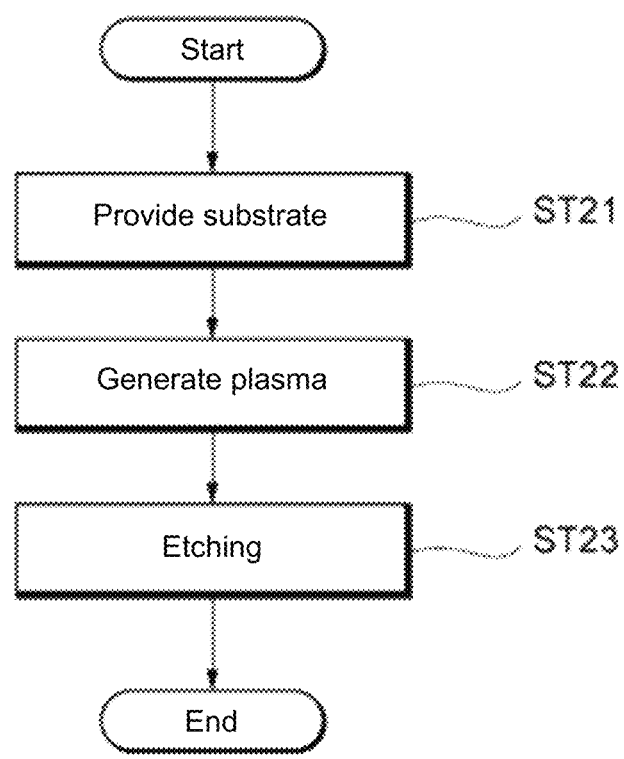
FIG. 9 is a flowchart of an etching method according to a second embodiment.

FIG. 9 is a flowchart of an etching method according to a second embodiment. As shown in FIG. 9, the etching method includes step ST21 for providing a substrate, step ST22 for generating plasma, and step ST23 for etching. The processing in each step may be performed in a plasma processing system shown in FIG. 1. In the embodiment described below, the controller 2 controls the components of the plasma processing apparatus 1 to perform etching on a substrate W.

Step ST21: Providing Substrate

In step ST21, the substrate W is provided to a plasma processing space 10s in the plasma processing apparatus 1. The substrate W is placed on the central area 111a included in the substrate support 11. The substrate W is held on the substrate support 11 by the ESC 1111. The substrate W provided in step ST21 may have the same structure as the substrate W described in the first embodiment (refer to FIG. 3).

After the substrate W is placed on the central area 111a of the substrate support 11, the temperature of the substrate support 11 is adjusted to a set temperature by the temperature control module, as in the first embodiment. The set temperature may be, for example, 20° C. or lower, 0° C. or lower, −10° C. or lower, −20° C. or lower, −30° C. or lower, −40° C. or lower. −50° C. or lower, −60° C. or lower, or—70° C. or lower. The temperature of the substrate support 11 may be adjusted to the set temperature before step ST21. During the processing in steps ST22 and ST23, the temperature of the substrate support 11 may be maintained at the set temperature reached by the adjustment in step ST21.

Step ST22: Generating Plasma

In step ST22, plasma is generated from a process gas. A gas supply unit 20 supplies the process gas into the plasma processing space 10s. The process gas may have the same composition as the first process gas, the second process gas, or both described in the first embodiment.

A source RF signal is then provided to the lower electrode of the substrate support 11, to the upper electrode of the shower head 13, or to both the electrodes. This causes generation of a high-frequency electric field between the shower head 13 and the substrate support 11, and generation of plasma from the process gas in the plasma processing space 10s.

Figure 10:
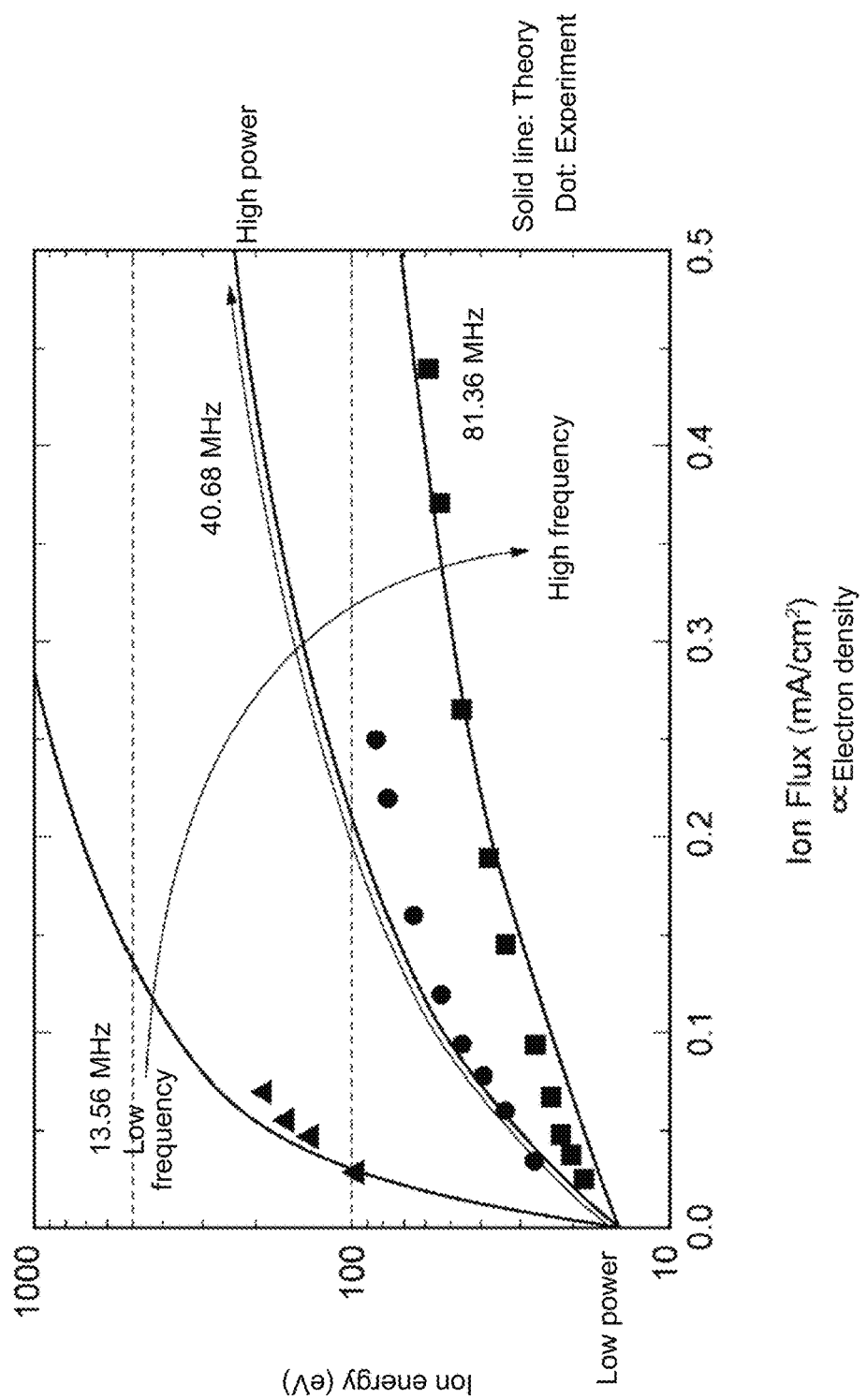
FIG. 10 is a graph showing the relationship between ion flux and ion energy.

FIG. 10 is a graph showing the relationship between ion flux and ion energy. As shown in FIG. 10, the ion energy is lower at higher source RF signal frequencies. The ion flux is greater and the electron density is higher at higher source RF signal frequencies. For example, among a source RF signal at a frequency of 40 MHz (RF40), a source RF signal at a frequency of 60 MHz (RF60), and a source RF signal at a frequency of 100 MHz (RF100), the relationships below hold.

Ion energy: RF40>RF60>RF100
Ion flux: RF40<RF60<RF100

In step ST22, the frequency of the source RF signal is selected to generate plasma with low ion energy and high density. Such frequency can vary depending on the plasma generation method used by the plasma processing apparatus and other factors. For example, when the source RF signal is provided to the upper electrode and the bias signal is provided to the lower electrode in the plasma processing apparatus 1, the source RF signal may have a frequency of 40 MHz or higher. For example, when the source RF signal is provided to the lower electrode and the bias signal is provided to the upper electrode in the plasma processing apparatus 1, the source RF signal provided to the lower electrode of the substrate support 11 may have a frequency of 60 MHz or higher. The source RF signal may have a frequency of 150 MHz or lower or 100 MHz or lower.

A bias signal is provided to the lower electrode of the substrate support 11. This generates a bias potential between the plasma and the substrate W. The bias potential attracts an active species such as ions and radicals in the plasma to the substrate W. The bias signal may be a bias RF signal provided from the second RF generator 31b. The bias signal may be a bias DC signal provided from the first DC generator 32a.

In step ST22, the source RF signal and the bias signal may both be continuous waves or pulsed waves, or one signal may be continuous and the other signal may be pulsed. The cycles of the source RF signal and the bias signal may be synchronized when both signals are pulsed. The pulse duty ratio may be set as appropriate, or set to, for example, 1 to 80% or 5 to 50%. The duty ratio is the percentage of the period in which the level of power or the level of voltage is higher in a pulse wave cycle. A bias DC signal used may have a rectangular, trapezoidal, or triangular pulse waveform, or a combination of these pulse waveforms. The bias DC signal may have either negative or positive polarity, and may adjust the potential of the substrate W to create a potential difference between the plasma and the substrate to draw ions.

Figure 11:
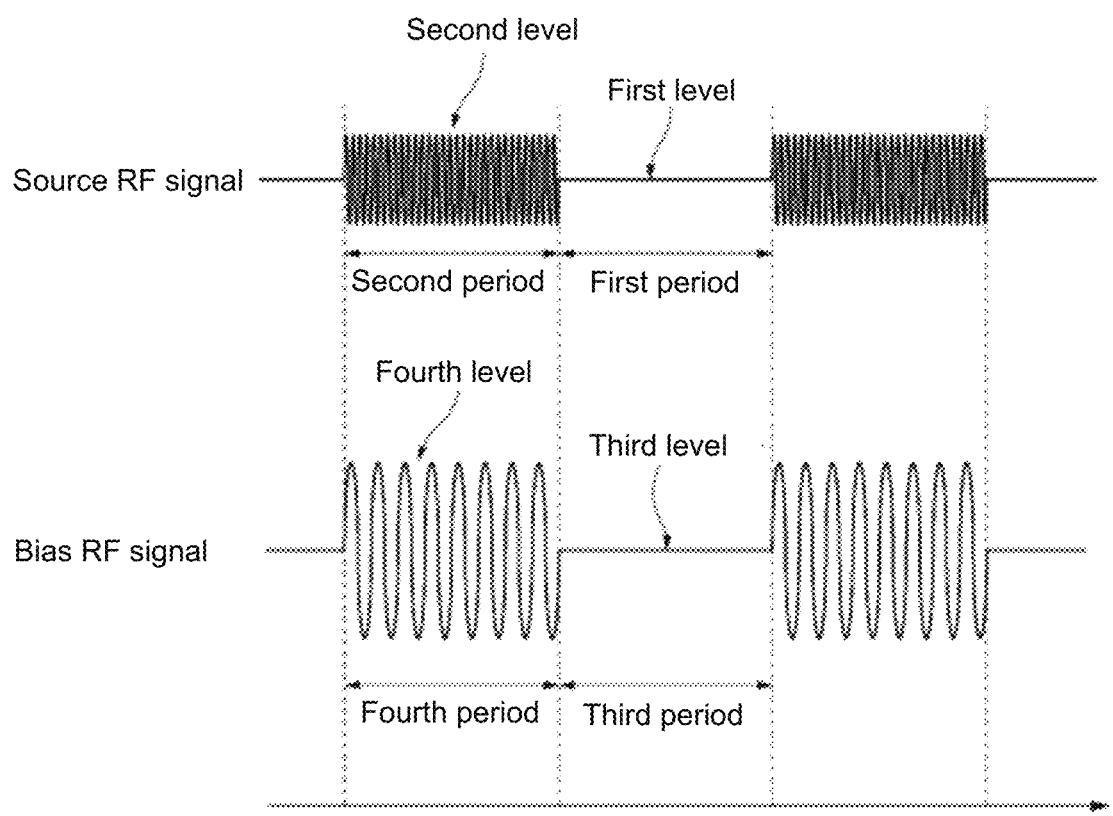
FIG. 11 is a timing chart showing an example source RF signal and an example bias RF signal.

FIG. 11 is a timing chart showing an example source RF signal and an example bias RF signal. In the example in FIG. 11, the RF signal and the bias RF signal are both pulsed waves. In FIG. 11, the horizontal axis indicates time. In one example, the source RF signal has a frequency in a range of 40 to 100 MHz inclusive. The source RF signal is provided to the lower electrode of the substrate support 11, to the upper electrode of the shower head 13, or to both the electrodes in a first period and a second period alternating with the first period. In FIG. 11, the first level is the level of power lower than the second level or 0 W.

The bias RF signal is provided to the lower electrode of the substrate support 11 in a third period and a fourth period alternating with the third period. The bias RF signal has a frequency in a range of 400 kHz to 13.56 MHz inclusive. In FIG. 11, the third level is the level of power lower than the fourth level or 0 W. As shown in FIG. 11, the second period and the fourth period may match (synchronize). The second period and the fourth period may not overlap partially or entirely.

Figure 12:
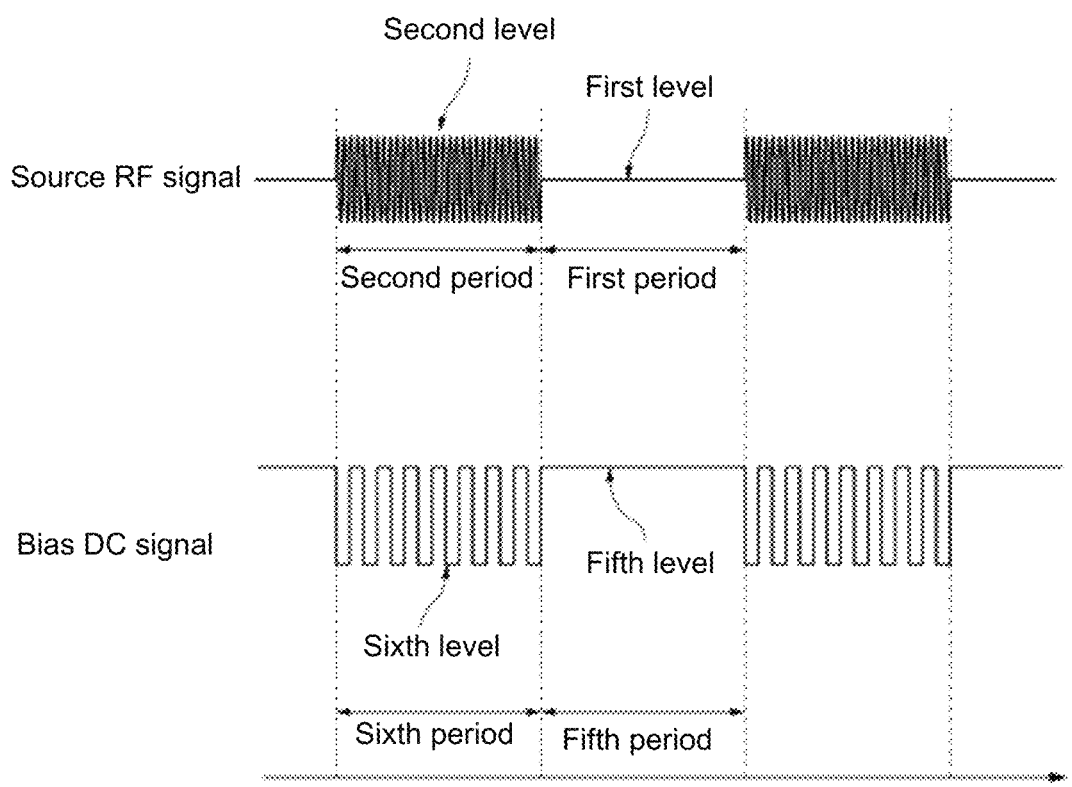
FIG. 12 is a timing chart showing an example source RF signal and an example bias DC signal.

FIG. 12 is a timing chart showing an example RF signal and an example bias DC signal. In the example in FIG. 12, the RF signal and the bias DC signal are both pulsed. In FIG. 12, the horizontal axis indicates time. The source RF signal is identical to the example shown in FIG. 11. The bias DC signal is provided to the lower electrode of the substrate support 11 in a fifth period and a sixth period alternating with the fifth period. In FIG. 12, the absolute value of the fifth level is lower than the absolute value of the sixth level or 0 V. As shown in FIG. 12, the second period and the sixth period may match (synchronize). The second period and the sixth period may not overlap partially or entirely.

In step ST22, a second bias signal may be provided to the upper electrode. The second bias signal may be a second DC signal provided from the second DC generator 32b or a bias RF signal provided from the second RF generator 31b. The second RF signal may be continuous waves or pulsed waves. In this case, positive ions in the plasma processing space 10s are attracted to and collide with the upper electrode, causing the upper electrode to emit secondary electrons. The emitted secondary electrons may modify the mask MF and improve the etching resistance of the mask MF. The emitted secondary electrons neutralize the charged substrate W, thus allowing more ions to be directed straight into a recess etched in the silicon-containing film SF. When the upper electrode is formed from a silicon-containing material, the collision of the positive ions causes the upper electrode to also emit silicon together with secondary electrons. The emitted silicon combines with oxygen in the plasma and is deposited on the mask MF as a silicon oxide compound to serve as a protective film. As described above, the second bias signal provided to the upper electrode improves the selectivity and the etching rate as well as reduces feature failures in the etched structure.

Step ST23: Etching

In step ST23, the silicon-containing film SF is etched by the plasma generated in the plasma processing space 10s to form a recess based on the feature of the opening OP in the mask MF. The etching is stopped upon the etched recess reaching a predetermined depth or the etching time reaching a predetermined duration.

With the etching method according to the second embodiment, the source RF signal in step ST22 has a frequency of 40 MHz or higher. At a source RF signal frequency of 40 MHz or higher, increasing the power of the source RF signal, the power of the bias signal, or both to increase the electron density of the plasma does not proportionally increase the ion energy. In other words, the use of a source RF signal with a frequency of 40 MHz or higher allows the electron density of the generated plasma to be controlled independently of the ion energy. In step ST22, plasma with higher density than at frequencies lower than 40 MHz can thus be generated with a relatively small increase in the energy of ions in the plasma. This increases the density of the etchant (HF species) in etching in step ST23, and also facilitates the adsorption of the etchant (HF species) by reducing the heat input into the substrate W. Damage to the mask MF can also be reduced by reducing the increase in the ion energy. Thus, the etching method according to the second embodiment improves the etching rate for the silicon-containing film SF as well as improves the selectivity of the silicon-containing film SF over the mask MF.

The above embodiments are mere examples described for illustrative purposes and are not intended to limit the scope of the present disclosure. The embodiments may be modified in various ways without departing from the spirit and scope of the present disclosure. For example, the etching method according to the first embodiment may be used in combination with the etching method according to the second embodiment. For example, the etching method according to the embodiments may be performed with, in addition to the capacitively coupled plasma processing apparatus 1, a plasma processing apparatus using any plasma source, such as an inductively coupled plasma source and a microwave plasma source.

The above embodiments also include the aspects described below.

Appendix 1

An etching method comprising:
(a) providing a substrate in a chamber, the substrate including an underlying film and a silicon-containing film on the underlying film;
(b) etching the silicon-containing film to form a recess with first plasma generated from a first process gas containing a hydrogen fluoride gas, the etching being performed until before the underlying film is exposed at the recess or until the underlying film is partly exposed at the recess, and
(c) further etching the silicon-containing film at the recess under a condition different from a condition of (b).

Appendix 2

The etching method according to appendix 1, wherein
(c) includes generating second plasma using a second process gas different from the first process gas.

Appendix 3

The etching method according to appendix 2, wherein the second plasma has lower density of a fluorine species than the first plasma Appendix 4

The etching method according to appendix 2 or appendix 3, wherein
the underlying film contains silicon, and the second process gas contains at least 50 vol % of a fluorocarbon gas or a hydrofluorocarbon gas and an oxygen-containing gas with respect to a total flow rate of a non-inert component of the second process gas.

Appendix 5

The etching method according to appendix 4, wherein the fluorocarbon gas or the hydrofluorocarbon gas contained in the second process gas has at least two carbon atoms.

Appendix 6

The etching method according to appendix 2 or appendix 3, wherein
the underlying film contains metal, the first process gas contains a fluorine-containing gas other than hydrogen fluoride, and the second process gas is free of the fluorine-containing gas or contains the fluorine-containing gas at a partial pressure lower than a partial pressure in the first process gas.

Appendix 7

The etching method according to appendix 6, wherein the fluorine-containing gas contains at least one of an $NF_3$ gas or an $SF_6$ gas.

Appendix 8

The etching method according to appendix 6 or appendix 7, wherein
the second process gas further contains at least one of a CO gas or a chlorine-containing gas.

Appendix 9

The etching method according to any one of appendixes 1 to 8, wherein
(c) includes controlling a temperature of the substrate to be higher than in (b).

Appendix 10

The etching method according to appendix 9, wherein
the controlling the temperature includes at least one selected from the group consisting of (I) increasing power of a source radio frequency signal or power of a bias signal provided to the chamber, (II) reducing an attracting force of a substrate support supporting the substrate. (III) reducing pressure of a heat-transfer gas supplied between the substrate and the substrate support, and (IV) increasing a set temperature of the substrate support to be higher than in (b).

Appendix 11

The etching method according to appendix 9 or appendix 10, wherein
the controlling the temperature includes controlling the temperature of the substrate to be at least 30° C. higher than in (b).

Appendix 12

The etching method according to any one of appendixes 1 to 11, wherein
(c) includes controlling pressure in the chamber to be lower than in (b).

Appendix 13

The etching method according to appendix 12, wherein
the controlling the pressure includes controlling the pressure in the chamber to be at least 30% lower than in (b).

Appendix 14

The etching method according to any one of appendixes 1 to 13, wherein
the first process gas further contains a phosphorus-containing gas.

Appendix 15

The etching method according to any one of appendixes 1 to 14, wherein
the first process gas contains at least one of a carbon-containing gas or an oxygen-containing gas.

Appendix 16

The etching method according to any one of appendixes 1 to 15, wherein
(b) includes controlling a temperature of a substrate support supporting the substrate to be 20° C. or lower.

Appendix 17

The etching method according to any one of appendixes 1 to 16, wherein
the chamber receives a source radio frequency signal having a frequency of 40 MHz or higher.

Appendix 18

An etching method comprising:
(a) providing a substrate in a chamber, the substrate including an underlying film and a silicon-containing film on the underlying film;
(b) etching the silicon-containing film to form a recess with plasma containing a hydrogen fluoride species, the etching being performed until before the underlying film is exposed at the recess or until the underlying film is partly exposed at the recess; and
(c) further etching the silicon-containing film at the recess under a condition different from a condition of (b).

Appendix 19

The etching method according to appendix 18, wherein
the hydrogen fluoride species is generated from at least one of a hydrogen fluoride gas or a hydrofluorocarbon gas.

Appendix 20

The etching method according to appendix 18 or appendix 19, wherein
the hydrogen fluoride species is generated from a hydrofluorocarbon gas having at least two carbon atoms.

Appendix 21

The etching method according to appendix 18, wherein
the hydrogen fluoride species is generated from a mixture gas containing a hydrogen source and a fluorine source.

Appendix 22

A plasma processing system, comprising:
a plasma processing apparatus including a chamber: and
a controller,
wherein the controller controls operations including
(a) providing a substrate in the chamber, the substrate including an underlying film and a silicon-containing film on the underlying film,
(b) etching the silicon-containing film to form a recess with first plasma generated from a first process gas containing a hydrogen fluoride gas, the etching being performed until before the underlying film is exposed at the recess or until the underlying film is partly exposed at the recess, and
(c) further etching the silicon-containing film at the recess under a condition different from a condition of (b).

Appendix 23

A device manufacturing method comprising:
(a) providing a substrate in a chamber, the substrate including an underlying film and a silicon-containing film on the underlying film;
(b) etching the silicon-containing film to form a recess with first plasma generated from a first process gas containing a hydrogen fluoride gas, the etching being performed until before the underlying film is exposed at the recess or until the underlying film is partly exposed at the recess; and (c) further etching the silicon-containing film at the recess under a condition different from a condition of (b).

Appendix 24

A non-transitory storage medium that has a program stored therein that is executable by a computer in a plasma processing system, the plasma processing system including a plasma processing apparatus including a chamber, and a controller, the program causing the computer to control operations comprising:
- (a) providing a substrate in the chamber, the substrate including an underlying film and a silicon-containing film on the underlying film;
- (b) etching the silicon-containing film to form a recess with first plasma generated from a first process gas containing a hydrogen fluoride gas, the etching being performed until before the underlying film is exposed at the recess or until the underlying film is partly exposed at the recess; and
- (c) further etching the silicon-containing film at the recess under a condition different from a condition of (b).

Appendix 25

A storage medium storing the program according to appendix 24.

Appendix 26

An etching method comprising:
- (a) providing a substrate in a chamber, the substrate including a silicon-containing film;
- (b) supplying a process gas containing a hydrogen fluoride gas to the chamber, and providing a radio frequency signal having a frequency of 40 MHz or higher to the chamber to generate plasma from the process gas; and
- (c) etching the silicon-containing film with the plasma.

Appendix 27

An etching method comprising:
- (a) providing a substrate in a chamber, the substrate including a silicon-containing film;
- (b) supplying a process gas to the chamber, and providing a radio frequency signal having a frequency of 40 MHz or higher to the chamber to generate plasma containing a hydrogen fluoride species from the process gas; and
- (c) etching the silicon-containing film with the plasma.

Appendix 28

A plasma processing system, comprising:
a plasma processing apparatus including a chamber; and
a controller,
wherein the controller controls operations including
- (a) providing a substrate in the chamber, the substrate including a silicon-containing film,
- (b) supplying a process gas containing a hydrogen fluoride gas to the chamber, and providing a radio frequency signal having a frequency of 40 MHz or higher to the chamber to generate plasma from the process gas, and
- (c) etching the silicon-containing film with the plasma.

Appendix 29

A device manufacturing method comprising:
- (a) providing a substrate in a chamber, the substrate including a silicon-containing film;
- (b) supplying a process gas containing a hydrogen fluoride gas to the chamber, and providing a radio frequency signal having a frequency of 40 MHz or higher to the chamber to generate plasma from the process gas, and
- (c) etching the silicon-containing film with the plasma.

Appendix 30

A program executable by a computer in a plasma processing system, the plasma processing system including a plasma processing apparatus including a chamber, and a controller, the program causing the computer to control operations comprising:
- (a) providing a substrate in the chamber, the substrate including a silicon-containing film;
- (b) supplying a process gas containing a hydrogen fluoride gas to the chamber, and providing a radio frequency signal having a frequency of 40 MHz or higher to the chamber to generate plasma from the process gas, and
- (c) etching the silicon-containing film with the plasma.

Appendix 31

A recording medium storing the program according to appendix 30.

REFERENCE SIGNS LIST

1 Plasma processing apparatus
2 Controller
10 Plasma processing chamber
10s Plasma processing space
11 Substrate support
13 Shower head
20 Gas supply unit
31a First RF generator
31b Second RF generator
32a First DC generator
SF Silicon-containing film
MF Mask
OP Opening
RC Recess
UF Underlying film
W Substrate

The invention claimed is:
1. An etching method comprising:
- (a) providing a substrate in a chamber, the substrate including an underlying film and a silicon-containing film on the underlying film;
- (b) etching the silicon-containing film to form a recess with a first plasma generated from a first process gas containing a hydrogen fluoride gas, the etching being performed until before the underlying film is exposed at the recess or until the underlying film is partly exposed at the recess; and

(c) further etching the silicon-containing film at the recess under a condition different from a condition of (b), thereby generating a second plasma using a second process gas different from the first process gas, wherein the second plasma has a lower density of a fluorine species than the first plasma.

2. The etching method according to claim 1, wherein
(c) includes controlling a temperature of the substrate to be higher than a temperature in (b).

3. The etching method according to claim 2, wherein the controlling the temperature includes at least one selected from the group consisting of (I) increasing power of a source radio frequency signal or power of a bias signal provided to the chamber, (II) reducing an attracting force of a substrate support supporting the substrate, (III) reducing pressure of a heat-transfer gas supplied between the substrate and the substrate support, and (IV) increasing a set temperature of the substrate support to be higher than in a temperature in (b).

4. The etching method according to claim 2, wherein the controlling the temperature includes controlling the temperature of the substrate to be at least 30° C. higher than the temperature in (b).

5. The etching method according to claim 1, wherein
(c) includes controlling pressure in the chamber to be lower than a pressure in (b).

6. The etching method according to claim 5, wherein the controlling the pressure includes controlling the pressure in the chamber to be at least 30% lower than the pressure in (b).

7. The etching method according to claim 1, wherein the first process gas further contains a phosphorus-containing gas.

8. The etching method according to claim 1, wherein the first process gas contains at least one of a carbon-containing gas or an oxygen-containing gas.

9. The etching method according to claim 1, wherein
(b) includes controlling a temperature of a substrate support supporting the substrate to be 20° C. or lower.

10. The etching method according to claim 1, further comprising:
applying in the chamber a source radio frequency signal having a frequency of 40 MHz or higher.

11. An etching method comprising:
(a) providing a substrate in a chamber, the substrate including an underlying film and a silicon-containing film on the underlying film;
(b) etching the silicon-containing film to form a recess with a first plasma generated from a first process gas containing a hydrogen fluoride gas, the etching being performed until before the underlying film is exposed at the recess or until the underlying film is partly exposed at the recess; and
(c) further etching the silicon-containing film at the recess under a condition different from a condition of (b),
wherein the underlying film contains silicon, and the second process gas contains at least 50 vol % of a fluorocarbon gas or a hydrofluorocarbon gas and an oxygen-containing gas with respect to a total flow rate of a non-inert component of the second process gas.

12. The etching method according to claim 11, wherein the fluorocarbon gas or the hydrofluorocarbon gas contained in the second process gas has at least two carbon atoms.

13. An etching method comprising:
(a) providing a substrate in a chamber, the substrate including an underlying film and a silicon-containing film on the underlying film;
(b) etching the silicon-containing film to form a recess with a first plasma generated from a first process gas containing a hydrogen fluoride gas, the etching being performed until before the underlying film is exposed at the recess or until the underlying film is partly exposed at the recess; and
(c) further etching the silicon-containing film at the recess under a condition different from a condition of (b),
wherein the underlying film contains metal, the first process gas contains a fluorine-containing gas other than hydrogen fluoride, and the second process gas is free of the fluorine-containing gas or contains the fluorine-containing gas at a partial pressure lower than a partial pressure in the first process gas.

14. The etching method according to claim 13, wherein the fluorine-containing gas contains at least one of an $NF_3$ gas or an $SF_6$ gas.

15. The etching method according to claim 13, wherein the second process gas further contains at least one of a CO gas or a chlorine-containing gas.

16. An etching method comprising:
(a) providing a substrate in a chamber, the substrate including an underlying film and a silicon-containing film on the underlying film;
(b) etching the silicon-containing film to form a recess with plasma containing a hydrogen fluoride species, the etching being performed until before the underlying film is exposed at the recess or until the underlying film is partly exposed at the recess; and
(c) further etching the silicon-containing film at the recess under a condition different from a condition of (b), thereby generating a second plasma using a second process gas different from the first process gas, wherein the second plasma has a lower density of a fluorine species than the first plasma.

17. The etching method according to claim 16, wherein the hydrogen fluoride species is generated from at least one of a hydrogen fluoride gas or a hydrofluorocarbon gas.

18. The etching method according to claim 16, wherein the hydrogen fluoride species is generated from a hydrofluorocarbon gas having at least two carbon atoms.

19. The etching method according to claim 16, wherein the hydrogen fluoride species is generated from a mixture gas containing a hydrogen source and a fluorine source.

20. A plasma processing system, comprising:
a plasma processing apparatus including a chamber; and
a controller,
wherein the controller is configured to control operations including
(a) providing a substrate in the chamber, the substrate including an underlying film and a silicon-containing film on the underlying film,
(b) etching the silicon-containing film to form a recess with first plasma generated from a first process gas containing a hydrogen fluoride gas, the etching being performed until before the underlying film is exposed at the recess or until the underlying film is partly exposed at the recess, and
(c) further etching the silicon-containing film at the recess under a condition different from a condition of (b), thereby generating a second plasma using a second process gas different from the first process gas, wherein the second plasma has a lower density of a fluorine species than the first plasma.

* * * * *